(12) United States Patent
Partow et al.

(10) Patent No.: US 6,424,169 B1
(45) Date of Patent: Jul. 23, 2002

(54) ACTIVE TERMINATION NETWORK

(75) Inventors: Anthony Partow, Dallas, TX (US); Erland Olson, Duarte, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/490,707

(22) Filed: Jan. 24, 2000

(51) Int. Cl.⁷ .............................................. H03K 17/16
(52) U.S. Cl. ......................................... 326/30; 326/26
(58) Field of Search ............................ 326/30, 27, 26, 326/21

(56) References Cited

U.S. PATENT DOCUMENTS

| | | | |
|---|---|---|---|
| 4,228,369 A | 10/1980 | Anantha et al. | |
| 5,055,836 A | 10/1991 | Kane | 340/2.28 |
| 5,166,561 A | * 11/1992 | Okura | 327/312 |
| 5,396,028 A | 3/1995 | Tomassetti | |
| 5,422,608 A | 6/1995 | Levesque | |
| 5,559,448 A | 9/1996 | Koenig | |
| 5,585,741 A | 12/1996 | Jordan | |
| 5,614,873 A | 3/1997 | Hageraats | |
| 5,680,060 A | 10/1997 | Banniza et al. | |
| 5,726,582 A | 3/1998 | Hedberg | |
| 5,939,896 A | 8/1999 | Hedberg | |
| 6,133,755 A | * 10/2000 | Huang et al. | 326/83 |

FOREIGN PATENT DOCUMENTS

| | | |
|---|---|---|
| WO | WO 96 16494 A | 5/1996 |
| WO | WO 99/37067 | 7/1999 |

\* cited by examiner

*Primary Examiner*—Michael Tokar
*Assistant Examiner*—James H Cho
(74) *Attorney, Agent, or Firm*—Christie, Parker & Hale, LLP

(57) ABSTRACT

An active termination for a transmission line comprising a reference impedance, a terminating impedance and a control circuit. The reference and terminating impedances are identical circuits made on the same integrated circuit in close proximity to one another. Both impedances are made of an active and a passive resistor in series. The active resistor is a CMOS transistor operated as a voltage controlled resistor. A control circuit senses the impedance of the reference impedance and generates a control signal to change the impedance of the reference and terminating impedances such that they are made equal to the impedance of the transmission line. An alternate embodiment of the invention comprises an active resistor and a passive resistor in series to form a terminating impedance network. A control circuit senses the voltage on the transmission line and adjusts the active resistor to terminate the transmission line with the correct value of resistance.

19 Claims, 3 Drawing Sheets

ACTIVE TERMINATION NETWORK

TECHNICAL FIELD

This invention relates generally to an active circuit for terminating a transmission line.

BACKGROUND OF THE INVENTION

Computer and communications systems frequently use transmission lines to transmit data within and to other systems and subsystems. Transmission lines must be properly terminated to minimize distortion of the transmitted signals. This is particularly important as the operating frequencies of transmission lines are increased to match the higher operating frequencies of the latest integrated circuits. Many systems and integrated circuits currently have operating frequencies in the GHz range.

Terminating networks are used to provide the correct terminating impedance. An off-chip precision resistor can provide transmission line termination. Off-chip resistors require significant circuit board space and increase board complexity and cost. The distance between the off-chip resistors and the transmission line to be terminated can be large enough to cause signal reflection problems. The use of on-chip termination resistors is preferred, but high precision resistors are difficult to form using standard CMOS processes due to manufacturing process and thermal variations. A resistor made by current CMOS processes could have a tolerance range of as much as 30%, which is totally unacceptable for use as a transmission line terminator. Laser trimming of on-chip CMOS resistors is expensive and to be avoided, if at all possible.

The use of active circuits, such as FETs (Field Effect Transistors), to terminate a transmission line is known in the art and there have been many approaches to this problem. It is also known in the art that a FET (a field effect transistor) behaves like a resistor for low currents and voltages, but that the channel resistance of a FET is non-linear. For instance, U.S. Pat. No. 5,422,608 describes "Adaptive Transmission Line Termination" in which a FET terminates a transmission line and an amplifier is used to control the voltage applied to the gate of the FET, thus allowing its resistance to be matched to the impedance of the transmission line.

SUMMARY OF THE INVENTION

It is an object of the present invention to provide an active circuit for terminating transmission lines and that may be composed of imprecise, high tolerance components configured to operate as a precision termination whose impedance varies only marginally from the characteristic impedance of the transmission line terminated.

The present invention improves upon previous attempts to provide an active termination circuit for terminating transmission lines with a high degree of accuracy, especially when made on an integrated circuit. This invention uses a reference impedance, which is a series combination of an active resistor and a passive resistor. The active resistor is a CMOS transistor operated as a voltage controlled resistor. A variable voltage is applied to the gate to control the drain to source resistance. The passive resistor is set to a fixed resistance.

The current through the reference impedance is set to a fixed value. A control circuit with a feedback loop senses the voltage across the reference impedance to generate a control voltage to control the resistance of the active resistor and thus control the resistance of the reference impedance.

The terminating impedance and the reference impedance are made as identical circuits formed at the same time on the same integrated circuit and as a result have identical properties. The terminating and reference impedances are designed to have the same impedance and are controlled by the same control voltage generated by a feedback loop.

An alternate embodiment of the invention does not use a reference impedance. An active resistor and a passive resistor in series form the terminating impedance circuit. A control circuit senses the voltage on the transmission line and adjusts the gate voltage to control the active resistor to terminate the transmission line with the correct value of resistance.

The present invention has many advantages, which will become clear from the detailed descriptions.

DETAILED DESCRIPTION OF THE PREFERRED EMBODIMENTS

Figure 1:
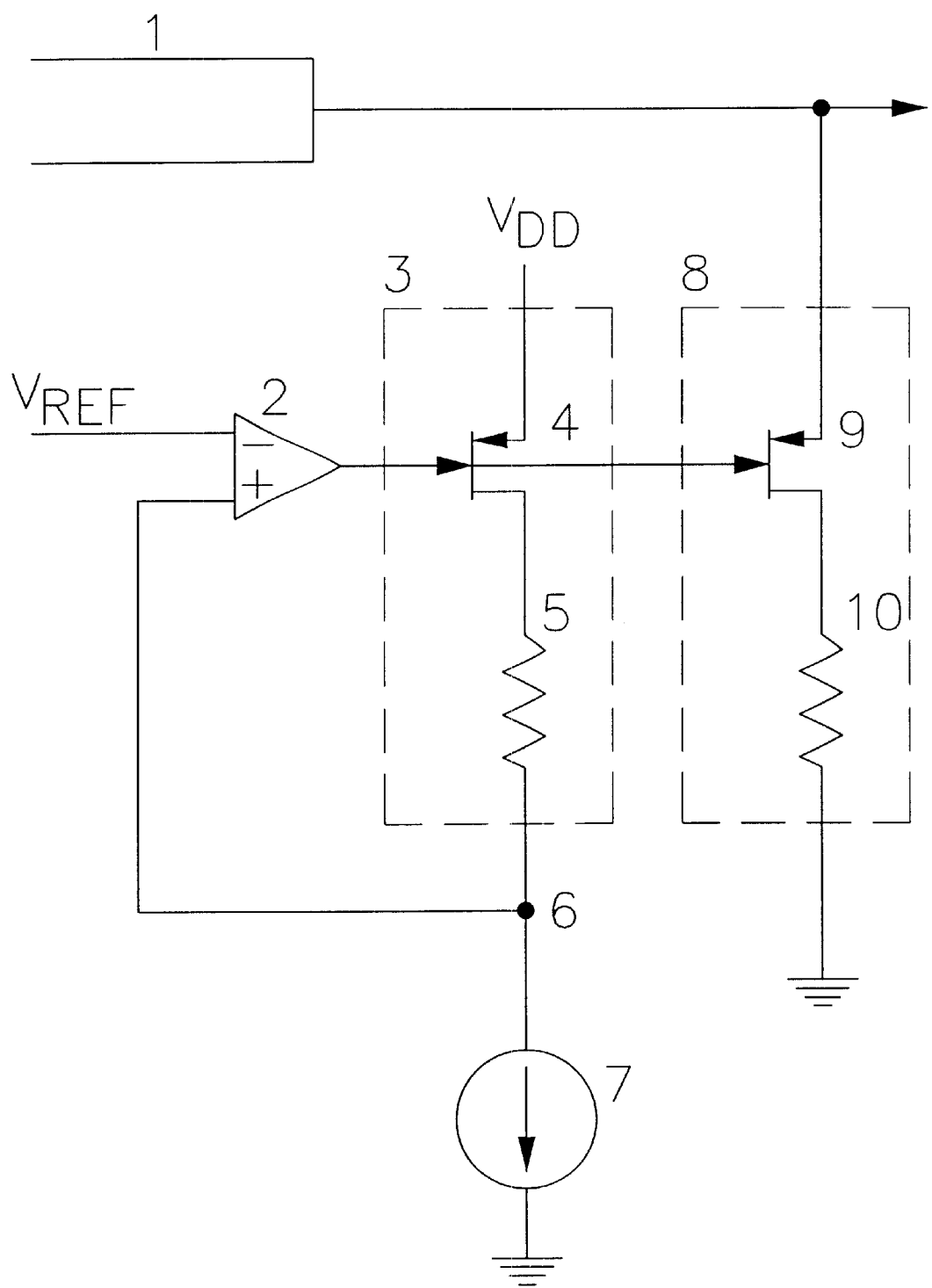
FIG. 1 shows a first embodiment of a transmission line termination circuit in accordance with the invention.

FIG. 1 shows a transmission line 1 terminated at the receiving end by terminating impedance network 8, which is made of an active resistor 9 in series with a passive resistor 10. Active resistor 4 and passive resistor 5 form a reference impedance 3, whose resistance is controlled by a control signal coming from op amp 2. As part of a negative feedback loop, op amp 2 compares the voltage drop across resistors 4 and 5 against a reference voltage Vref to generate a control voltage which controls the drain to source voltages of active resistors 4 and 9, thus controlling the channel resistances of 4 and 9. Current source 7 limits the current flow through the reference resistance 3.

The present invention relies on the well-known fact that a FET behaves like a resistor for low currents and voltages, but the channel resistance of a FET is non-linear.

The channel resistance of a FET is non-linear and varies as the drain to source voltage of the device is changed. Since a FET is used to terminate a transmission line, it is subject to this non-linearity caused by the voltage swing on the line. In order to reduce this voltage sensitivity, this circuit incorporates a resistor 10 in series with the FET 9. (A POLY resistor is used as resistor 10 in this embodiment, but other resistors can be used.) The nominal resistance of the POLY resistor is chosen to be approximately equal to the nominal FET channel resistance, hence the maximum voltage variation seen across the FET is cut by half and its overall non-linearity contribution is reduced by a factor of 2.

The ratio between the active and passive resistors need not be 1 to 1, but can be adjusted during the design of the active terminator to suit a particular application.

In a present embodiment, current source 7 limits the current flow through the reference resistance 3 to 10 mA. Op amp 2 generates a control signal to keep the voltage drop at node 6 to 0.5 volts below the supply voltage Vdd. As a result, the resistance of 3 is equal to 0.5 v/10 ma, which is 50 ohms, which is a common characteristic impedance for transmission lines. In order for the feedback loop to hold the resistance 3 at 50 ohms, the reference voltage Vref should be 0.5 volts below the supply voltage Vdd. Selection of the specific circuit values will depend on the operating conditions of a particular transmission line. As an example of how this embodiment would function, if the signal on the transmission line is driven by a current source with a current limit of 10 mA, then the current source 7 should have a value of 10 mA. The current source should have this value because the more similar the operating conditions (such as maximum current load) of the terminating impedance 8 and reference impedance 3, the more equivalent their impedances will be, the importance of which is described below.

Reference resistance 3 and terminating resistance 8 are designed as identical circuits on the same integrated circuit. Because of their physical proximity and creation through identical manufacturing processes, they will have virtually identical properties. The closer that resistances 3 and 8 are to each other on the same integrated circuit, the more equivalent their thermal environments and performances will be. As the control voltage is automatically varied by the feedback loop to keep the reference impedance 3 at a value of 50 ohms, the same voltage is used to keep terminating impedance 8 at a 50 ohm value. Thus, the transmission line is terminated with an impedance of the correct resistance.

Parameters can be changed so that the resistance 3 matches whatever characteristic impedance the transmission line in use has, making the monitoring of the transmission line voltage in this embodiment unnecessary. This and other circuit design adjustments, such as accommodating transmission lines driven by a voltage source or having different termination impedances can be made by those skilled in the art.

This invention is able to provide a termination impedance which is within 5% of the characteristic impedance of the transmission line being terminated. This is a considerably better impedance match (or equivalence) between the terminating impedance and characteristic impedance of the transmission line than can be achieved with the use of passive on-chip resistors alone as terminating impedances, as was discussed in the background section of this application.

This invention can also easily accommodate ratios between the terminating impedance and the reference impedance other than one to one. For example, if it were important to limit the power consumption of an integrated circuit as much as possible, and the terminating impedance was 50 ohms, then the reference impedance could be designed to be 500 ohms. This would reduce the overall power consumption of the reference impedance by 90 percent. Such a modification of the invention can be made by those skilled in the art.

It is also possible for those skilled in the art, to use this invention for terminating balanced transmission lines.

Adapting this invention such that the terminating impedance is in series with the transmitting end of the transmission line is well known to those skilled in the art.

Figure 2:
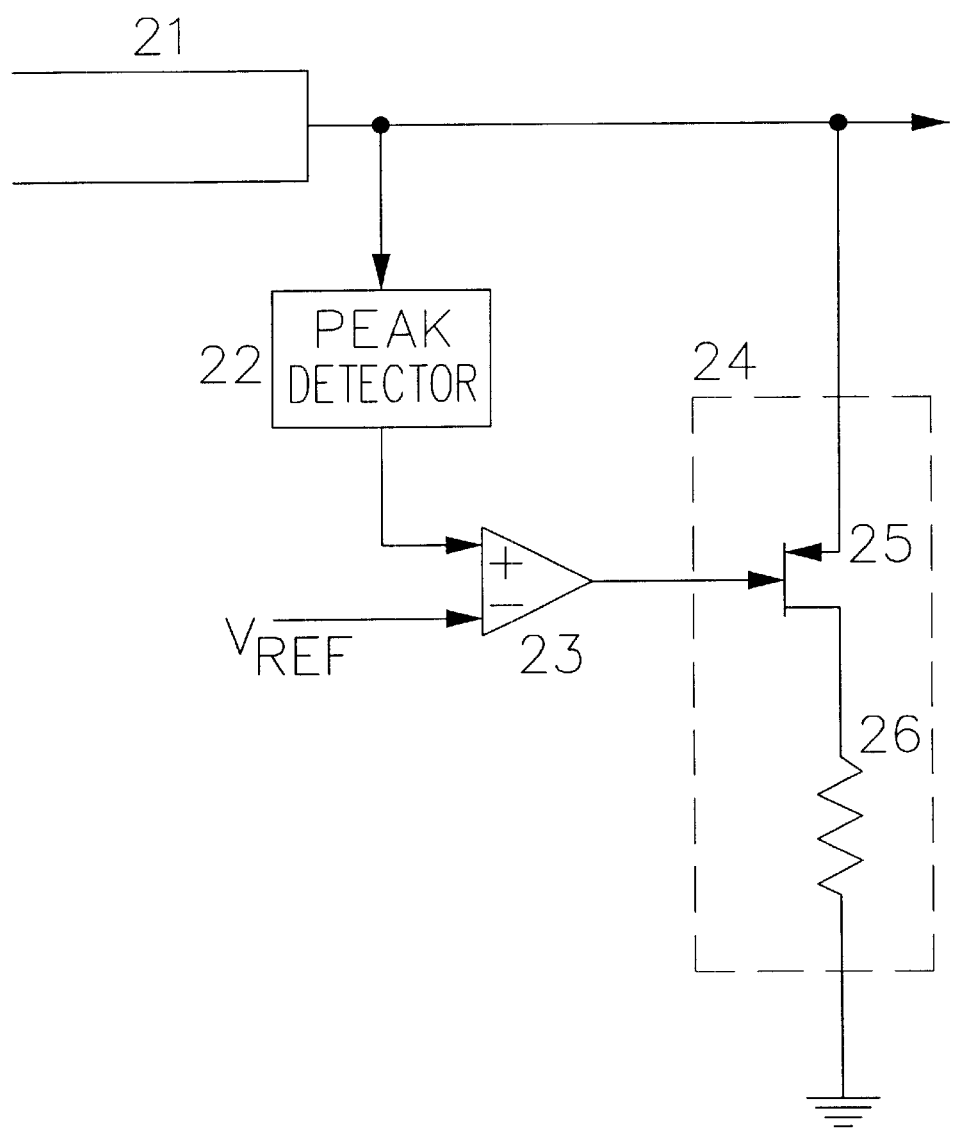
FIG. 2 shows an alternate embodiment in accordance with the invention.

FIG. 2 is an alternate embodiment of the invention, in which a control circuit directly controls the terminating impedance.

FIG. 2 shows a transmission line 21 terminated at the receiving end by a terminating impedance 24, which is made of an active resistor 25 in series with a passive resistor 26. As part of a negative feedback loop, peak detector 22 senses the voltage on the transmission line. The peak detector 22 then generates a voltage which op amp 23 compares against a reference voltage Vref to generate a control voltage. This control voltage at the output op amp 23 determines the drain to source voltage of active resistor 25, thus controlling the channel resistance of active resistor 25. The reference voltage Vref applied to op amp 23 is chosen so that the output of op amp 23 controls the resistance of FET 25 so that the resistance of the terminating impedance 24 matches the impedance of transmission line 21.

Voltage level detection circuits such as peak detectors are well known to those skilled in the art and their design and use need no further elaboration.

Figure 3:
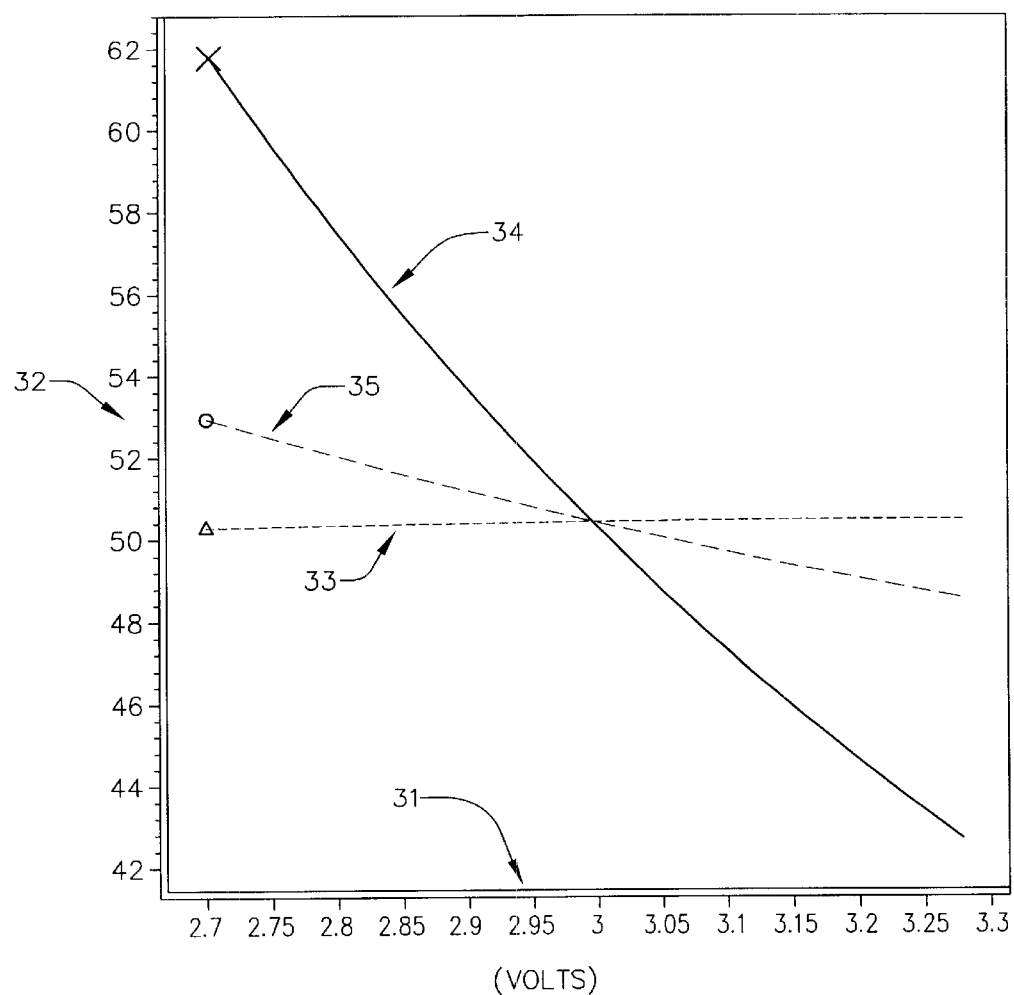
FIG. 3 shows a simulation of comparison of passive, active, and passive/active combination resistances in accordance with the invention.

FIG. 3 shows simulation results comparing resistances of passive, active, and passive plus active resistors over a voltage range. (FIG. 3 is simply an example for a specific application to illustrate and verify the overall usefulness of the invention.) The vertical axis 32 shows resistance in ohms. The horizontal axis 31 shows the voltage variation generated by a variable voltage source applied to one end of the device being tested (passive resistor, active PFET or resistor and PFET in series connection). A 3.3 Volt voltage supply is connected to the other end of the device being tested in the simulation. The variable voltage source produces voltages between 2.7 and 3.3 volts, Consequently, the voltage across the device tested varies between 0.0 V and 0.6 V in this simulation.

Graph 33 shows the voltage across the 50 ohm passive resistor only as the voltage across the resistor varies. As expected, the resistance remains 50 ohms across the voltage range. Graph 34 shows the non-linear resistance of the active PFET 9 only as the voltage across the PFET varies. Graph 34 in FIG. 3 shows that the resistance of the PFET varies between approximately 42 to 62 ohms over a change in the voltage of 0.6 volts. The resistance of the PFET exhibits a tolerance range of −16 percent to +24 percent as compared to the desired resistance of 50 ohms. Graph 35 in FIG. 3 shows that the series resistance of the PFET and a 25 ohm resistor varies between approximately 48 and 53 ohms over a voltage change of 0.6 volts. This means that the resistance of the PFET in series with the resistor exhibits a tolerance range of −4 percent to +6 percent as compared to the desired resistance of 50 ohms. These simulation results show the superior performance of the series combination of the PFET and the resistor as an active impedance.

In actual operation, voltages at the end of the transmission line 1 vary with the bit transmitted on the line. This results in a changing voltage across termination network 8 and attendant fluctuations in the channel resistance of the PFET 9 depending on the bit being transmitted. As the simulation shows, use of a passive series resistor with the PFET 9 in the termination network reduces impedance fluctuations across the termination network 8 dramatically for a given voltage fluctuation, allowing the impedance of the of the termination network to vary only a few ohms around the characteristic impedance of the transmission line (50 ohms), as is shown by comparing graphs 33 and 35 in FIG. 3. Thus, as graph 35 shows, the PFET plus resistor network is able to match the characteristic impedance of the transmission line 8 (50 ohms) much more closely than a termination network consisting of a PFET only, represented by 34 in the graph. The reduced resistance fluctuation reduces signal reflections along the transmission line and allows a higher range of operating frequencies.

Although the present invention has been described in detail, it should be understood that various changes, substitutions and alterations can be made without departing from the spirit and scope of the invention as defined solely by the appended claims.

What is claimed is:

1. A transmission line termination circuit comprising:

a connection to a transmission line;

a terminating impedance connected to said transmission line through said connection, including an active impedance and a passive impedance connected in series;

a reference impedance, including an active impedance and a passive impedance connected in series, wherein said reference impedance is manufactured with properties proportional to the properties of the terminating impedance;

a control circuit for generating a control signal for controlling the impedance of the active impedance of the reference impedance, in order for the reference impedance to match the characteristic impedance of the transmission line; and said control signal controls the impedance of the active impedance of the terminating impedance in order for the terminating impedance to substantially equal the characteristic impedance of the transmission line.

2. The transmission line terminating circuit of claim 1, wherein the terminating impedance is connected in parallel with the transmission line.

3. The transmission line terminating circuit of claim 1, wherein the terminating impedance is connected in series with the transmission line.

4. The transmission line terminating circuit of claim 1, wherein the active impedance of the reference impedance comprises a transistor.

5. The transmission line terminating circuit of claim 4, wherein said transistor is a field effect transistor.

6. The transmission line terminating circuit of claim 1, wherein the active impedance of the terminating impedance comprises a transistor.

7. The transmission line terminating circuit of claim 6, wherein said transistor is a field effect transistor.

8. The transmission line terminating circuit of claim 1, wherein the reference impedance and the terminating impedance are disposed on the same integrated circuit.

9. The transmission line terminating circuit of claim 1, wherein the transmission line carries a balanced signal and is terminated by a balanced termination.

10. The transmission line terminating circuit of claim 1, wherein the reference impedance is manufactured to have properties substantially identical to the properties of the terminating impedance.

11. The transmission line terminating circuit of claim 1, wherein the ratio of voltage across the reference impedance to current through reference impedance is substantially constant and substantially equal to the characteristic impedance of said transmission line.

12. The transmission line terminating circuit of claim 1 wherein the ratio of voltage across the terminating impedance to current through the terminating 13. A method of controlling the active impedance of a terminating impedance for terminating a transmission line, comprising the steps of:

sensing the voltage across a series-connected active resistor and passive resistor of a reference impedance;

comparing the sensed voltage to a reference voltage;

generating a control voltage in response to variations in the sensed voltage;

varying the resistance of the active resistor of said reference impedance in response to said control signal, and;

varying the resistance of an active resistor of a terminating impedance in response to said control signal such that the terminating impedance substantially equals the characteristic impedance of the transmission line.

14. The method of claim 13 further comprising applying said control voltage to the gate of a field effect transistor to vary the resistance of the transistor.

15. The method of claim 13 further comprising connecting the terminating impedance in parallel with the transmission line.

16. The method of claim 13 further comprising connecting the terminating impedance in series with the transmission line.

17. The method of claim 13 further comprising: maintaining the ratio of voltage across the reference impedance to current through reference impedance at a substantially constant level and substantially equal to the characteristic impedance of said transmission line.

18. The method of claim 13 further comprising maintaining the ratio of voltage across the terminating impedance to current through the terminating impedance at a substantially constant level and substantially equal to the reference impedance.

19. The transmission line terminating circuit of claim 13, wherein the reference impedance is manufactured to have properties substantially identical to the properties of the terminating impedance.

* * * * *

UNITED STATES PATENT AND TRADEMARK OFFICE
CERTIFICATE OF CORRECTION

PATENT NO.    : 6,424,169 B1  
DATED         : July 23, 2002  
INVENTOR(S)   : Anthony Partow and Erland Olson It is certified that error appears in the above-identified patent and that said Letters Patent is hereby corrected as shown below:

Column 6,  
Line 8, after the word "terminating" insert -- impedance is substantially constant and substantially equal to the reference impedance. --  
Line 41, after "constant level" delete "and substantially".

Signed and Sealed this

Tenth Day of February, 2004

JON W. DUDAS  
*Acting Director of the United States Patent and Trademark Office*